United States Patent [19]

Des Brisay, Jr.

[11] Patent Number: 4,695,743

[45] Date of Patent: Sep. 22, 1987

[54] MULTIPLE INPUT DISSYMMETRIC LATCH

[75] Inventor: George S. Des Brisay, Jr., Hemet, Calif.

[73] Assignee: Hughes Aircraft Company, Los Angeles, Calif.

[21] Appl. No.: 790,568

[22] Filed: Oct. 23, 1985

[51] Int. Cl.$^4$ .............................. H03K 3/284; H03K ; H03K 19/02; H03K 3/26; H03K 3/29

[52] U.S. Cl. ................................ 307/272.2; 307/446; 307/279; 307/291

[58] Field of Search .................. 307/450, 272 A, 443, 307/445–446, 291, 279, 594, 605

[56] References Cited

U.S. PATENT DOCUMENTS 3,845,330 10/1974 Colonel ............................... 307/291
4,514,649 4/1985 Nuzillat et al. ...................... 307/450
4,518,871 5/1985 Toyoda et al. ...................... 307/443

OTHER PUBLICATIONS

Tech. Notes, RCA, "TTL to CMOS Buffer Circuit", Dingwall, TN No. 1114, Jun. 11, 1975.

Primary Examiner—Stanley D. Miller
Assistant Examiner—M. R. Wambach
Attorney, Agent, or Firm—S. M. Mitchell; M. J. Meltzer; A. W. Karambelas

[57] ABSTRACT

An integrated circuit latch is provided for providing first and second output signals, each first output signal being a logical complement of a corresponding second output signal; the latch includes means for receiving a first clock signal; means for receiving a corresponding second clock signal, the second clock signal being a logical complement of the first clock signal; means for receiving N first data signals, where N is an integer and N<1; means for receiving N second data signals, where each second data signal corresponds to a first data signal and is the logical complement of a corresponding first data signal; NOR-OR logic function means for providing the first output signal characterized by the OR function of first and second logic inputs, the first logic input characterized by the NOR function of the second output and the second clock signal, the second logic input characterized by the NOR function of the first data signals and the first clock signal; and NAND-AND logic function means for providing the second output signal characterized by the AND function of third and fourth logic inputs, the third logic input characterized by the NAND function of the first output signal and the first clock signal, said fourth logic input characterized by the NAND function of the second data signals and the second clock signal.

7 Claims, 12 Drawing Figures

MULTIPLE INPUT DISSYMMETRIC LATCH

BACKGROUND OF THE INVENTION

1. Field of the Invention

The invention relates generally to digital logic systems and more particularly to high speed digital logic systems.

2. Description of the Related Art

There is a trend in present digital systems toward increased data processing speeds. This trend has spurred the development of very high speed integrated circuits. For example, Rory L. Von Tuyl, et al in "GaAs MESFET Logic with 4-GHz Clock Rate", I.E.E.E. Journal of Solid State Circuits, Vol. SC-12, No. 5, October 1977, described high-speed, GaAs MESFET integrated circuit buffered field-effect-transistor (FET) gates capable of implementing NAND-AND and NOR-OR type logic. The high-speed capabilities of such merged logic gate structures is largely due to the fact that there is substantially only one logic gate propagation delay between the application of an input data signal to such a gate and the provision of an output signal by the gate. The development of such high speed gates has made possible a contemporaneous development of digital logic systems which operate at frequencies high enough to take maximum advantage of their high speed.

The flip-flop and its constituent, the latch cell, are key building blocks in digital logic systems, and therefore, there has been a growing need for very high-speed flip-flops and latch cells. Von Tuyl, et al described a high-speed master-slave set-reset (SR) flip-flop utilizing complementary clocks and incorporating logic gates of the type described above. An exemplary flip-flop of the type disclosed by Von Tuyl, et al is illustrated in FIG. 1.

The high-speed characteristics of the flip-flop described by Von Tuyl, et al largely stemmed from the fact that a data storage slave latch was active only during the portion of the clocking cycle when the data storage command (CLOCK) was activated, and a data entry master latch was active only during the portion of the clocking cycle when the data entry command ($\overline{CLOCK}$) was activated. Thus, the flip-flop took advantage of the high-speed characteristics of its constituent logic gates, and for example, the time necessary for data entry into the data entry master latch was substantially only one logic gate propagation delay (e.g., from R to $\overline{Q}_m$).

While high-speed flip-flops of the type described by Von Tuyl, et al generally have been satisfactory, there have been limitations with their use. For example, flip-flops of the type described by Von Tuyl, et al have been implemented as high-speed D flip-flops by inputting data corresponding to a D signal into a terminal corresponding to the S input and by inputting data corresponding to a $\overline{D}$ signal into a terminal corresponding to the R input. In complex logic systems, however, often it is desirable to have a D flip-flop capable of receiving multiple D data input signals; that is, instead of providing one data input signal to a single S terminal, often it is desirable to provide a plurality of data input signals to a plurality of S terminals. Unfortunately, the flip-flop disclosed by Von Tuyl, et al does not satisfactorily implement a D flip-flop which can receive multiple data input signals. This is because the provision of multiple data input signals to multiple S terminals of a master latch would require the provision of corresponding multiple complementary input signals to multiple R terminals of the master latch. A master latch of the type disclosed by Von Tuyl, et al, however, does not satisfactorily process multiple input signals and their corresponding multiple complementary signals.

One solution to this problem might be to add a differential stage or an additional inverting stage to a master latch to internally generate a single D input and a corresponding single $\overline{D}$ input from multiple data input signals. For example, Zuleeg, et al in U.S. Pat. No. 4,038,563 discloses a source-coupled logic NOR-/NAND gate comprising an inverter for receiving three input signals and providing two complementary output signals. A disadvantage of such a solution is that a differential stage or an inverting stage would require additional propagation delay which could slow the operation of the flip-flop to such an extent that it would not take full advantage of the high-speed of its constituent logic gates. Therefore, such solutions significantly degrade the high-speed performance of the flip-flop and substantially diminish its usefulness in high-speed systems.

Thus, there has been a need for a high-speed electronic circuit capable of receiving multiple data input signals and generating complementary output signals with substantially only one logic gate delay between the input signals and the corresponding output signals. The present invention meets this need.

SUMMARY OF THE INVENTION

In one embodiment, the present invention comprises an integrated circuit latch for providing first and second output signals, the first output signal being a logical complement of the corresponding second output signal. The latch comprises a circuit for performing a NOR-OR multiple logic function and a circuit for performing a NAND-AND multiple logic function. The NOR-OR logic circuit provides the first output signal which is characterized by the OR function of first and second logic inputs. The first logic input is characterized by the NOR function of the second output signal and a second clock signal, and the second logic input is characterized by the NOR function of multiple first data signals and a first clock signal. The NANDAND logic circuit provides the second output signal which is characterized by the AND function of third and fourth logic inputs. The third logic input is characterized by the NAND function of the first output signal and the first clock signal, and the fourth logic input is characterized by the NAND function of multiple second data signals and the second clock signal. Each second data signal corresponds to a first data signal and is the logical complement of its corresponding first data signal.

In one alternative embodiment, the present invention comprises a flip-flop including first and second merged logic circuits suitable for receiving multiple first data signals and multiple second data signals; wherein each second data signal corresponds to a first data signal and is a logical complement of its corresponding first data signal. The merged logic circuits further are suitable for receiving a clock signal. The merged logic circuits can provide mutually complementary output signals substantially within a time period of two logic gate propagation delays after the reception of the first and second data signals and a clock signal.

Furthermore, the invention comprises a method of providing first and second mutually complementary output signals. The method comprises the steps of receiving first and second mutually complementary clock signals and receiving multiple first and corresponding multiple second data signals; wherein each first data signal is a logical complement of its corresponding second data signal. The method also comprises the step of performing a first logical function characterized by an OR function of first and second logic inputs. The first logic input is characterized by a NOR function of the second output signal and the second clock signal, and the second logic input is characterized by a NOR function of the first data signals and the first clock signal. The method further comprises the step of performing a second logical function characterized by an AND function of third and fourth logic inputs. The third logic input is characterized by the NAND function of the first output signal and the first clock signal, and the fourth logic input is characterized by the NAND function of the second data signals and the second clock signal.

Thus, the present invention provides a high speed electronic circuit and an associated method for processing multiple data input signals and providing mutually complementary output signals. These and other advantages of the present invention will become more apparent from the following detailed description of exemplary embodiments thereof, as illustrated in the accompanying drawings.

BRIEF DESCRIPTION OF THE DRAWINGS

The purpose and advantage of the present invention will be apparent to those skilled in the art from the following detailed description in conjunction with the appended drawings in which.

DESCRIPTION OF THE PREFERRED EMBODIMENTS

The present invention provides a novel high-speed electronic circuit. In one embodiment, the electronic circuit receives multiple data input signals and generates complementary output signals with substantially only one logic gate delay between the input signals and the corresponding output signals. The following description is presented to enable any person skilled in the art to make and use the invention, and is presented in the context of particular applications and their requirements. Various modifications and improvements to the preferred embodiments will be readily apparent to those skilled in the art, and the generic principles herein may be applied to other embodiments and applications. Thus, the present invention is not intended to be limited to the embodiments shown, but it is to be accorded the widest scope consistent with the princples and features disclosed herein.

Figure 2:
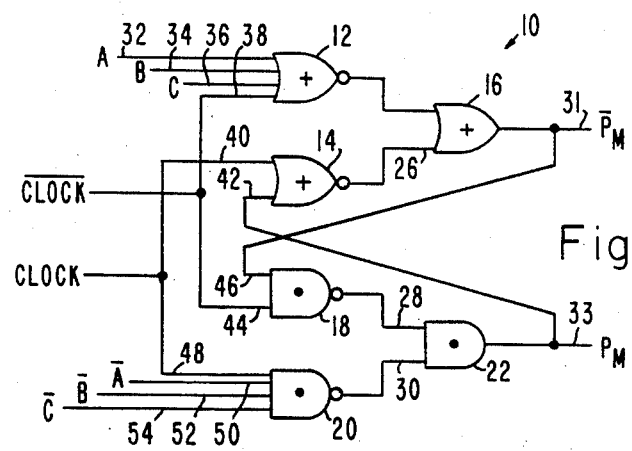
FIG. 2 is a schematic diagram of a latch circuit embodying the present invention.

Referring to the schematic drawings of FIG. 2, a first illustrative embodiment of an electronic circuit of the present invention is shown. The first embodiment comprises a novel latch cell 10. The latch cell 10 includes respective first and second NOR logic gates 12 and 14, an OR logic gate 16, respective first and second NAND logic gates 18 and 20, and an AND logic gate 22. An output of the first NOR logic gate 12 is operatively connected to a first input of the OR logic gate 16 by line 24, and an output of the second NOR logic gate 14 is operatively connected to a second input of the OR logic gate 16 by line 26. An output of the first NAND logic gate 18 is operatively connected to first input of the AND logic gate 22 by line 28, and an output of the second NAND logic gate is operatively connected to a second input of the AND logic gate 22 by line 30. The OR logic gate 16 provides on output line 31 a first output signal, $\overline{P}_M$, which comprises a first output of the latch cell 10, and the AND logic gate 22 provides an output line 33 a second output signal, $P_M$, which comprises a second output of the latch cell 10. The respective first and second output signals, $\overline{P}_M$ and $P_M$, are logical complements of each other.

The first NR logic gate 12 receives respective first, second and third data signals, A, B and C, on respective lines 32, 34 and 36 and receives first clock signal $\overline{CLOCK}$, on line 38.

The second NOR logic gate 14 receives second clock signals, CLOCK, on line 40 and receives the second output signal, $P_M$, on line 42.

The first clock signal, $\overline{CLOCK}$, and the second clock signal, CLOCK, are periodic clock signals which are 180° out of phase with one another, and, therefore, are complementary with respect to one another. The clock signals are generated by appropriate means such as, for example, a differential circuit which forms no part of the present invention and which will be understood by those skilled in the art.

The first NAND logic gate 18 receives the first clock signal, $\overline{CLOCK}$, on line 44 and receives the first output signal, $\overline{P}_M$, on line 46.

The second NAND logic gate 20 receives the second clock signals, CLOCK, on line 48 and receives respective fourth, fifth and sixth data signals, $\overline{A}$, $\overline{B}$, and $\overline{C}$ on respective lines 50, 52 and 54.

The respective first, second, third, fourth, fifth and sixth data signals, A, B, C, $\overline{A}$, $\overline{B}$, and $\overline{C}$, comprise voltage signals carrying information in the form of strings of logical "1's" and "0's". The first data signals, A, are the logical complements of the fourth data signals, $\overline{A}$. Thus, for each logical "1" provided by the first data signals, A, there is a corresponding logical "0" provided by the fourth data signals, $\overline{A}$, and for each logical "0" provided by the first data signals, A, there is a corresponding logical "1" provided by the fourth data signals, $\overline{A}$. Similarly, the second and fifth data signals, B and $\overline{B}$, respectively, are the logical complements of one another, and the third and sixth data signals, C and $\overline{C}$, respectively, are the logical complements of one another. Those skilled in the art will appreciate that parts of complementary signals such as the first and fourth signals, A and $\overline{A}$, respectively, may, for example, be generated by appropriate means, which form no part of the present invention, such as by a flip-flop providing complementary output signals.

Figure 1:
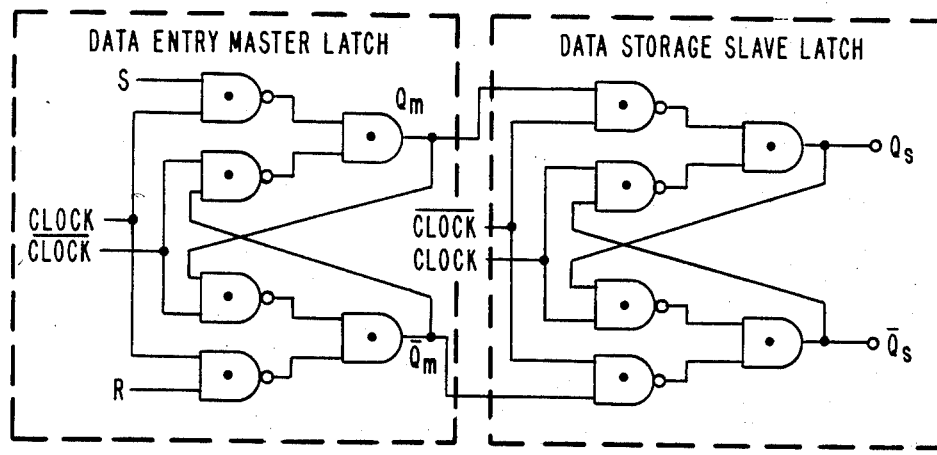
FIG. 1 is a schematic diagram of a prior art master-slave flip-flop.

The master latch 10 is characterized as dissymmetric due to the novel arrangement of its constituent gates. The arrangement of gates is called dissymmetric because it lacks symmetry since the respective first and second NOR gate 12 and 14 and the OR gate 16 perform a NOR-OR logic function, and the respective first and second NAND gates 18 and 20 and the AND gate 22 perform a NAND-AND logic function. Thus the dissymmetric novel arrangement may be contrasted with the symmetric arrangement of the prior art as shown in FIG. 1 wherein both the S and R data signals are received by NAND gates. This dissymmetric arrangement of gates advantageously permits the dissymmetric master latch 10 to receive multiple data signals A, B and C and corresponding multiple complementary data signals $\overline{A}$, $\overline{B}$ and $\overline{C}$ and to provide corresponding complementary master latch output signals, $\overline{P}_M$ and $P_M$.

Figure 3:
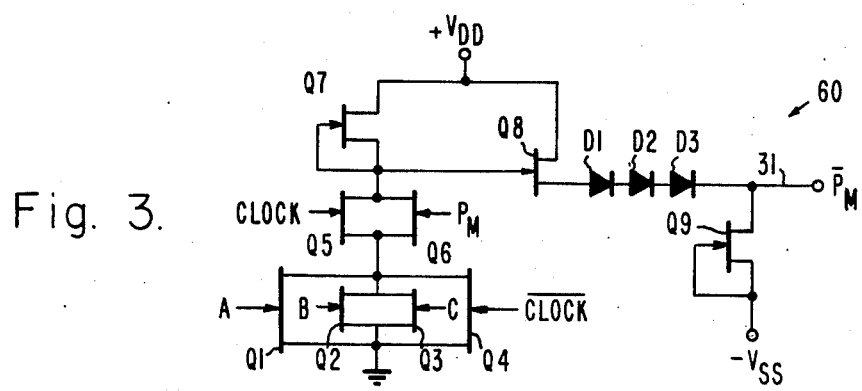
FIG. 3 is a circuit diagram of a first depletion mode MESFET logic circuit of the latch circuit of FIG. 2.

Referring now to FIG. 3, a first depletion mode MESFET logic circuit 60 is shown which implements the first and second NOR logic gates 12 and 14, respectively, and the OR logic gate 16 of the dissymmetric latch 10 illustrated in FIG. 2. The first MESFET logic circuit 60 includes a plurality of depletion mode MESFET devices, $Q_1$, $Q_2$, $Q_3$, $Q_4$, $Q_5$, $Q_6$, $Q_7$, $Q_8$, and $Q_9$ and Schottky diodes, $D_1$, $D_2$ and $D_3$ arranged as shown and formed on a gallium arsenide (GaAs) substrate. Depletion mode MESFETs on a GaAs substrate advantageously provide very high speed performance.

Transistors $Q_1$, $Q_2$, $Q_3$, $Q_4$, $Q_5$ and $Q_6$ perform the logic switching function of the first depletion mode MESFET logic circuit 60. Switch transistors $Q_1$, $Q_2$, $Q_3$, and $Q_4$ have source electrodes connected to ground and have drain electrodes connected to the source electrodes of transistors $Q_5$ and $Q_6$. Transistors $Q_5$ and $Q_6$ have drain electrodes coupled to a $+V_{DD}$ supply through load transistor $Q_7$. The respective gate electrodes of switch transistors $Q_1$, $Q_2$, $Q_3$, $Q_4$, $Q_5$, and $Q_6$, respectively receive the first, second and third logical signals A, B and C, the first clock signals, $\overline{CLOCK}$, the second clock signals, CLOCK, and the second output signal, $P_M$.

Transistor $Q_7$ is a high impedance active load which provides pull-up current for the switch transistors. The drain electrode of transistor $Q_7$ is connected to a $+V_{DD}$ supply, and its source electrode is connected to its gate electrode and to the drain electrodes of transistors $Q_5$ and $Q_6$.

The source electrode of the load transistor $Q_7$ is susceptible to capacitive loading. For this reason, a buffer circuit comprising transistor $Q_8$, which is connected as a source follower, is incorporated into the first MESFET logic circuit 60. Transistor $Q_8$ serves as a buffer due to its relatively high input impedance and its relatively low output impedance which makes it relatively insensitive to capacitive loading so that maximum circuit speed can be achieved. The drain electrode of transistor $Q_8$ is connected to the $+V_{DD}$ supply, and its source electrode is connected to the anode of diode $D_1$.

Diodes $D_1$, $D_2$ and $D_3$ and transistor $Q_9$ cooperate to provide a voltage offset which substantially maintains the logic voltage levels of the first output signals, $\overline{P}_M$, provided on output line 31, at substantially the same logic voltage levels as the signals provided to respective gate electrodes of transistors $Q_1$, $Q_2$, $Q_3$, $Q_4$, $Q_5$ and $Q_6$. In the preferred embodiment, a logic voltage level of approximately 0 volts corresponds to logical state "1", and a logic voltage level of approximately −2 volts corresponds to a logical state of "0". More particularly, diodes $D_1$, $D_2$ and $D_3$ are connected in series, and each provides a voltage drop of approximately 0.9 volts for a total voltage drop of about 2.7 volts. Transistor $Q_9$ has its drain electrode coupled to the cathode of diode $D_3$. Its source electrode is coupled to a $-V_{SS}$ supply and to its gate electrode. Thus, transistor $Q_9$ acts a current source which continuously draws current through diodes $D_1$, $D_2$ and $D_3$, regardless of whether the first output signal $\overline{P}_M$ is a logical "1" or a logical "0", to provide a voltage offset of approximately 2.7 volts to signals provided at the source electrode of source follower transistor $Q_8$; substantially the same voltage logic levels thereby are maintained at both output line 31 and at the respective gate electrodes of transistors $Q_1$, $Q_2$, $Q_3$, $Q_4$, $Q_5$ and $Q_6$.

The value of $+V_{SS}$, for example, can be approximately 3.5 volts, and $-V_{SS}$, for example, can be approximately −2.5 volts.

Figure 4:
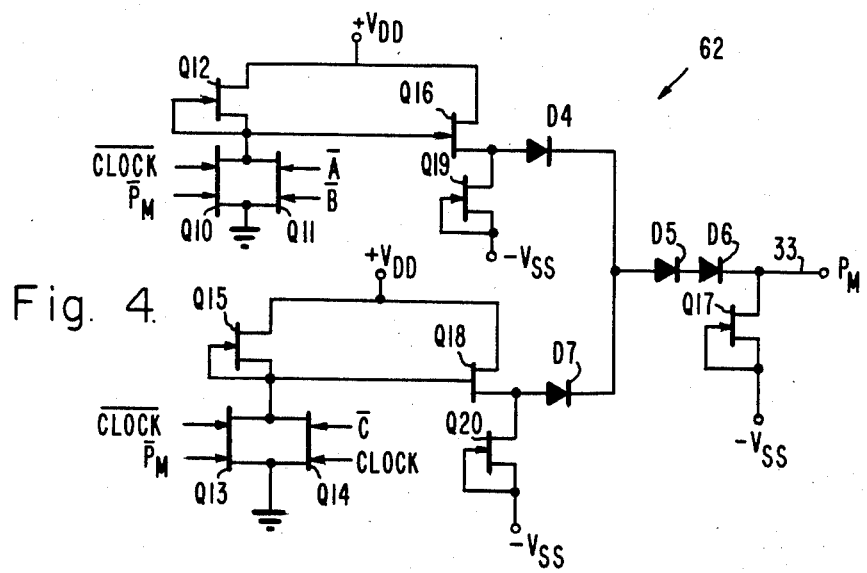
FIG. 4 is a circuit diagram of a second depletion mode MESFET logic circuit of the latch circuit of FIG. 2.

FIG. 4 illustrates a second depletion mode MOSFET logic circuit 62 which implements the first and second NAND logic gates, 18 and 20 respectively, and the AND logic gate 22 of the dissymmetric latch 10 illustrated in FIG. 2. The second depletion mode MESFET logic circuit 62 comprises a plurality of depletion mode MESFET devices, $Q_{10}$, $Q_{11}$, $Q_{12}$, $Q_{13}$, $Q_{14}$, $Q_{15}$, $Q_{16}$, $Q_{17}$, $Q_{18}$, $Q_{19}$ and $Q_{20}$ and Schottky diodes, $D_4$, $D_5$, $D_6$ and $D_7$ arranged as shown and formed on a GaAs substrate.

Transistors $Q_{10}$, $Q_{11}$, $Q_{13}$ and $Q_{14}$ and diodes $D_4$ and $D_7$ perform the logic switching function of the second MESFET logic circuit 62. Switch transistors $Q_{10}$ and $Q_{11}$ each are dual gate transistors which have their source electrodes connected to ground and which have their drain electrodes coupled to a $+V_{DD}$ supply through load transistor $Q_{12}$. The two respective gate electrodes of switch transistor $Q_{10}$ recieve the first clock signals, $\overline{CLOCK}$, and the first output signal $\overline{P}_M$, and the two respective gate electrodes of switch transistor $Q_{11}$ receive the fourth and fifth data signals, $\overline{A}$ and $\overline{B}$ respectively.

Similarly, switch transistors $Q_{13}$ and $Q_{14}$ each are dual gate transistors which have their source electrodes connected to ground and which have their drain electrodes coupled to a $+V_{DD}$ supply through load transistor $Q_{15}$. The two respective gate electrodes of switch transistor $Q_{13}$ receive the first clock signals, $\overline{CLOCK}$, and the first output signal $\overline{P}_M$, and the two respective gate electrodes of switch transistor $Q_{14}$ receive the sixth data signal, $\overline{C}$, and the second clock signals, CLOCK.

Transistor $Q_{12}$ serves as a high impedance active load which provides pull-up current for switch transistors $Q_{10}$, and $Q_{11}$, and transistor $Q_{15}$ serves as a high impedance active load which provides pull-up current for switch transistors $Q_{13}$ and $Q_{14}$. The drain electrode of transistor $Q_{12}$ is coupled to a $+V_{DD}$ supply, and its source electrode is connected to its gate electrode and to the drain electrodes of switch transistors $Q_{10}$ and $Q_{11}$. Similarly, the drain electrode of transistor $Q_{15}$ is coupled to a $+V_{DD}$ supply, and its source electrode is connected to its gate electrode and to the drain electrodes of switch transistors $Q_{13}$ and $Q_{14}$.

The source electrodes of load transistor $Q_{12}$ and $Q_{15}$ each are susceptible to capacitive loading. Therefore, source follower transistors $Q_{16}$ and $Q_{18}$ are provided to serve as respective buffers for the respective source electrodes of load transistors $Q_{12}$ and $Q_{15}$. The drain electrode of transistor $Q_{16}$ is connected to a $+V_{DD}$ supply; its source electrode is connected to the anode of diode $D_4$, and its gate electrode is connected to the source electrode of load transistor $Q_{12}$. The drain electrode of transistor $Q_{18}$ is connected to a $+V_{DD}$ supply; its source electrode is connected to the anode of diode $D_7$, and its gate electrode is connected to the source electrode of load transistor $Q_{15}$.

Diodes $D_4$, $D_5$ and $D_6$ and transistor $Q_{17}$ cooperate to provide a voltage offset which substantially maintains the logic voltage levels of the second output signals, $P_M$, provided on output line 33 at substantially the same logic voltage levels as the signals provided to respective gate electrodes of transistors $Q_{10}$ and $Q_{11}$. Similarly, diodes $D_7$, $D_5$ and $D_6$ and transistor $Q_{17}$ cooperate to provide a voltage offset which substantially maintains the logic voltage levels of the second output signals, $P_M$, provided on output line 33 at substantially the same voltage logic levels as the signals provided to respective gate electrode of transistors $Q_{13}$ and $Q_{14}$. As with the first depletion mode MESFET logic circuit 60 described above, a logic voltage level of approximately 0 volts corresponds to logic state "1", and a logic voltage level of approximately $-2$ volts corresponds to a logical state of "0".

The cathode of diode $D_4$ is connected to the anode of diode $D_5$. The cathode of diode $D_7$ also is connected to the anode of diode $D_5$. The cathode of diode $D_5$ is connected to the anode of diode $D_6$. The cathode of diode $D_6$ is coupled to output line 33 at which the second output signal, $P_M$, is provided. The cathode of diode $D_6$ also is connected to the source electrode of transistor $Q_{17}$. The source electrode of transistor is connected to a $-V_{SS}$ supply, and to its own gate electrode.

Thus, transistor $Q_{17}$ serves as a current source which continuously draws current through a current path through series connected diodes $D_4$, $D_5$ and $D_6$ and through a current path through series connected diodes $D_7$, $D_5$ and $D_6$ regardless of whether the second output signal, $P_M$, is a logical "1" or a logical "0". Therefore, a voltage offset of approximately 2.7 volts is provided to respective signals at the source electrodes of respective transistors $Q_{16}$ and $Q_{18}$ to thereby substantially maintain the same voltage logic levels at output line 33 and at the gate electrodes of transistors $Q_{10}$, $Q_{11}$, $Q_{13}$ and $Q_{14}$.

Diodes $D_4$ and $D_7$, in addition to contributing to the voltage offset, cooperate to perform the logical OR function to signals provided at the respective source electrodes of transistors $Q_{16}$ and $Q_{18}$.

Transistors $Q_{19}$ and $Q_{20}$ are connected as current sources. Transistor $Q_{19}$ has a drain electrode connected between the source electrode of transistor $Q_{16}$ and the anode of diode $D_4$, and it has a source electrode connected to a $-V_{SS}$ supply and to its own gate electrode. Transistor $Q_{20}$ has a drain electrode connected between the source electrode of transistor $Q_{18}$ and the anode of diode $D_7$, and it has a source electrode connected to a $-V_{SS}$ supply and to its own gate electrode. Current source transistors $Q_{19}$ and $Q_{20}$ serve to substantially minimize any difference in output signal voltage levels measured on output line 33 when, for example, only the source electrode of transistor $Q_{16}$ or only the source electrode of transistor $Q_{17}$ is at a high logic level (logical state "1") and when both the source electrodes of $Q_{16}$ and $Q_{17}$ are at high logic levels.

The respective first and second depletion mode MESFET logic circuits 60 and 62 are merged logic structures each utilizing known technology. The first and second circuits 60 and 62 are characterized as merged because each performs multiple logic functions with substantially only a single gate propagation delay between the reception of input data signals and an appropriate clock signal and the provision of a corresponding output signal. The first logic circuit 60 performs a NOR-OR multiple logic function, and the second logic circuit 62 peforms a NAND-AND multiple logic function.

The master latch 10 of FIG. 2, which comprises the respective first and second logic circuits 60 and 62, therefore, can receive multiple data input signals and corresponding multiple complementary data input signals and can provide corresponding complementary output signals, $\overline{P}_M$ and $P_M$, substantially within the time span of one gate propagation delay.

Figure 5:
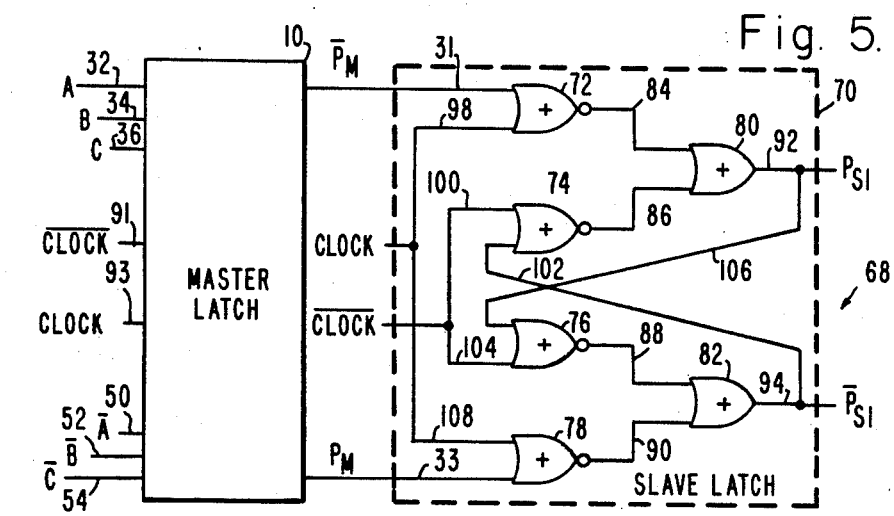
FIG. 5 is a schematic diagram of a first master-slave flip-flop incorporating the latch circuit of FIG. 2.

Referring to the illustrative drawings of FIG. 5, there is shown a master-slave flip-flop 68 in which the master latch 10 comprises the novel dissymmetric latch 10 described above with respect to FIGS. 2, 3 and 4 and a known first slave latch 70. The slave latch 70 comprises first, second, third and fourth NOR logic gates, 72, 74, 76 and 78, respectively, and first and second OR logic gates, 80 and 82, respectively.

Respective outputs of the respective first and second NOR logic gates, 72 and 74, are operatively connected by respective lines 84 and 86 to first and second inputs to the first OR logic gate 80. Respective outputs of the respective third and fourth NOR logic gates, 76 and 78, are operatively connected by respective lines 88 and 90 to first and second inputs to the second OR logic gate 82. The first OR logic gate 80 provides on line 92 a first slave latch first output signal, $P_{SI}$, and the second OR logic gate 82 provides on line 94 first slave latch second output signal, $\overline{P}_{S1}$. The respective slave latch first and second output signals, $P_{S1}$ and $\overline{P}_{S1}$, are logical complements of each other. The first slave latch first output signal, $P_{S1}$, of course, also is the logical complement master latch first output signal, $\overline{P}_M$ after the outputs of the master latch 10 and first slave latch 70 have settled.

The first NOR logic gate 72 receives the master latch first output signal, $\overline{P}_M$ on line 31 from the master latch cell 10 and receives the second clock signals, CLOCK on line 98. The second NOR logic gate 74 receives the first clock signals, $\overline{\text{CLOCK}}$, on line 100 and and receives the first slave latch second output signal, $\overline{P}_{S1}$, on line 102. The third NOR logic gate 76 receives the first clock signals, $\overline{\text{CLOCK}}$, on line 104 and receives the slave latch first output signal, $P_{SI}$ on line 106. The fourth NOR logic gate 78 receives the second clock signals, CLOCK, on line 108 and receives the second master latch output signal, $P_M$, on line 33.

The master latch 10 receives the respective first and second clock signals, $\overline{CLOCK}$ and CLOCK, on respective lines 91 and 93, and it receives respective first, second, third, fourth, fifth and sixth data signals, A, B, C, $\overline{A}$, $\overline{B}$ and $\overline{C}$, on respective lines 32, 34, 36, 50, 52, and 54. The details of the master latch 10 are set forth above in the description regarding FIGS. 2, 3 and 4.

Figures 6, 7:
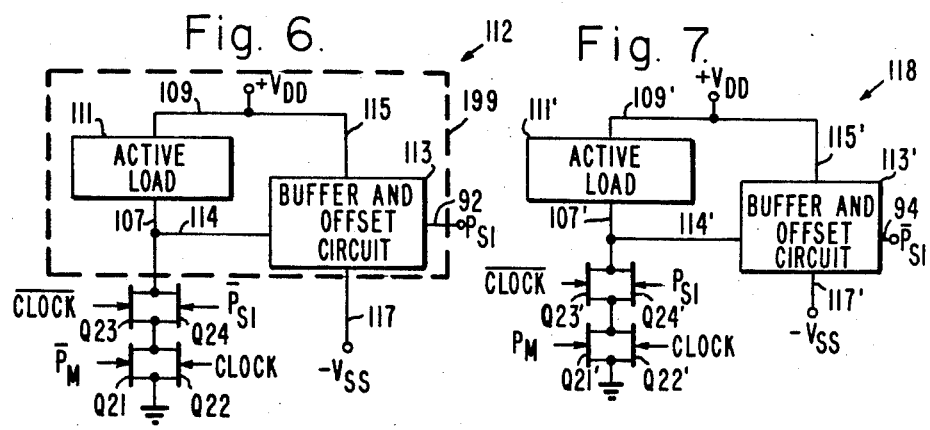
FIG. 6 is a circuit diagram of a third depletion mode MESFET logic circuit of a slave latch of the flip-flop of FIG. 5.
FIG. 7 is a circuit diagram of a fourth depletion mode MESFET logic circuit of the slave latch of the flip-flop of FIG. 5.

FIG. 6 illustrates a third depletion mode MESFET logic circuit 112 which implements the first and second NOR logic gates, 72 and 74 respectively, and the first OR logic gate 80 of the slave latch cell of FIG. 5. The third depletion mode MESFET logic gate 112 comprises a plurality of depletion mode MESFET devices, $Q_{21}$, $Q_{22}$, $Q_{23}$, $Q_{24}$ arranged as shown and fabricated on a gallium arsenide (GaAs) substrate.

Transistors $Q_{21}$, $Q_{22}$, $Q_{23}$ and $Q_{24}$ perform the logic switching function of the third MESFET logic circuit 112. Switch transistors $Q_{21}$ and $Q_{22}$ have source electrodes connected to ground and have drain electrodes connected to source electrodes of switch transistors $Q_{23}$ and $Q_{24}$. Switch transistors $Q_{23}$ and $Q_{24}$ have drain electrodes coupled to a $+V_{DD}$ supply through an active load 111, which for example, may be substantially identical to the MESFET active load devices described above with regard to FIGS. 3 and 4. The respective gate electrodes of switch transistors $Q_{21}$, $Q_{22}$, $Q_{23}$ and $Q_{24}$ respectively receive the master latch first output signals, $\overline{P}_M$, the second clock signals, CLOCK, the first clock signals, $\overline{CLOCK}$, and the slave latch second output signals, $\overline{P}_{S1}$.

The active load 111, which provides pull-up current for the switch transistors, is connected by line 109 to a $+V_{DD}$ supply, and is connected by line 107 to the drain electrodes of transistors $Q_{23}$ and $Q_{24}$. The active load 111, for example, can be substantially identical to the active load described above with regard to the respective first and second logic circuits 60 and 62.

The drain electrodes of switch transistors $Q_{23}$ and $Q_{24}$, are susceptible to capacitive loading. Thus, the third logic circuit 112 includes a buffer and offset circuit 113, coupled by line 114 to the drain electrodes of transistors $Q_{23}$ and $Q_{24}$, coupled by line 115 to a $+V_{DD}$ supply and coupled by line 117 to a $-V_{SS}$ voltage. The buffer and offset circuit 113, for example, can be substantially identical to the buffer circuit described above with regard to the respective first and second logic circuits 60 and 62.

Output line 92 from buffer circuit 113 provides the slave latch first output signal, $P_{S1}$.

FIG. 7 illustrates a fourth depletion mode MESFET logic circuit 118 which implements the third and fourth NOR logic gates 76 and 78, respectively, and the second OR gate 82 of the slave latch cell of FIG. 5. The fourth MESFET logic circuit 118 comprises a plurality of depletion mode MESFET devices $Q_{21}'$, $Q_{22}'$, $Q_{23}'$ and $Q_{24}'$ which serve as logic switching devices and which are arranged as shown and and are formed on a GaAs substrate.

The components comprising the respective third and fourth MESFET logic circuits 112 and 118 and the connections between these components are substantially identical. The only features of the fourth logic circuit 118 which differ significantly from corresponding features of the third logic circuit 112 are the nature of the signals provided to the gate electrodes of the logic switching tansistors $Q_{21}'$, $Q_{22}'$, $Q_{23}'$ and $Q_{24}'$ and the slave latch second output signal, $\overline{P}_{S1}$, provided on output line 94. Thus, only these different input signals and output signals are described in detail herein. Components of the fourth logic circuit 118 which have corresponding components in the third logic circuit 112 are identified by primed reference numerals identical to the reference numerals of the corresponding components illustrated in FIG. 6 and described above with regard to the third logic circuit 112.

More specifically, the gate electrodes of respective switch transistors $Q_{21}'$, $Q_{22}'$, $Q_{23}'$ and $Q_{24}'$ respectively receive the master latch second output signal, $P_M$, the second clock signals CLOCK the first clock signals $\overline{CLOCK}$ and the slave latch first output signal, $P_{S1}$. Output line 94 from buffer circuit 113' provides the slave latch second output signal, $\overline{P}_{S1}$.

Figure 8:
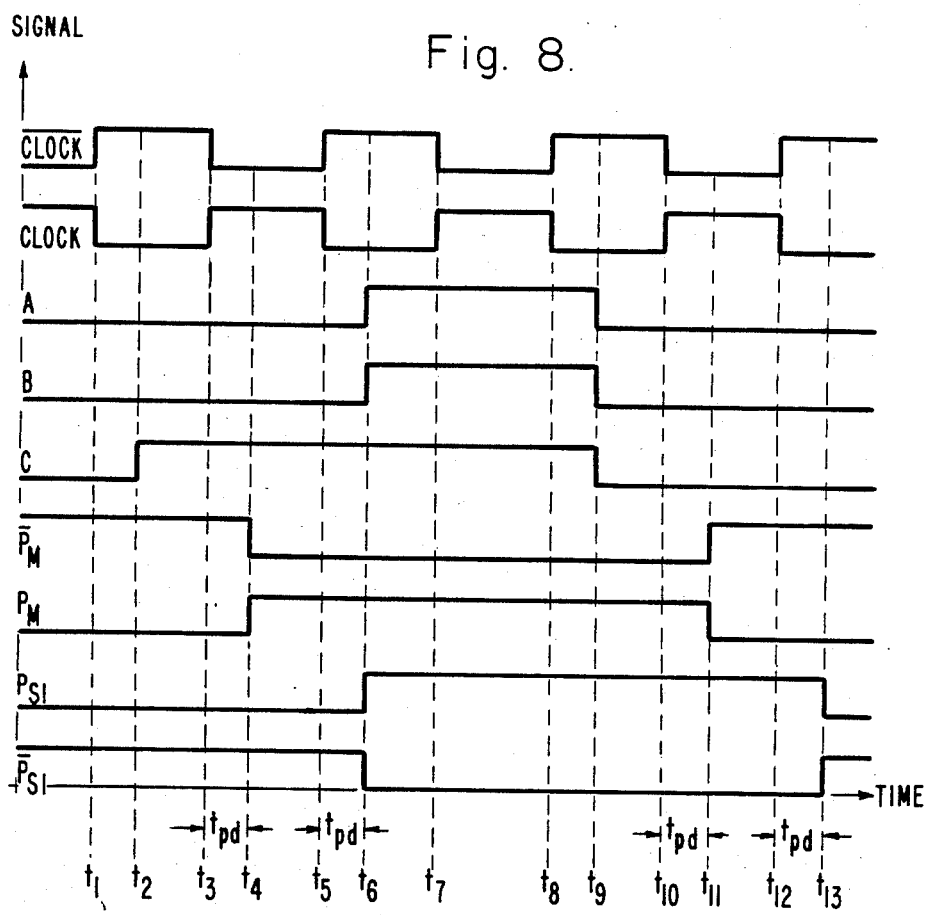
FIG. 8 is an exemplary timing diagram illustrating the operation of the flip-flop of FIG. 5.

The operation of the master latch 10 of FIG. 2 and the master-slave flip-flop 68 of FIG. 5 will be appreciated from the exemplary timing diagram of FIG. 8.

Referring to FIG. 8, at time $t_0$ first clock signal, $\overline{CLOCK}$ is a logical 0, and the second clock signal, CLOCK, therefore, is a logical 1. First, second and third data signals, A, B and C each are logical 0. The master latch first output signal, $\overline{P}_M$, is a logical 1, and the master latch second output signal, $P_M$, is a logical 0. The first slave latch first output signal, $P_{S1}$, is a logical 0, and the first slave latch second output signal, $\overline{P}_{S1}$, is a logical 1.

At time $t_1$, the first and second clock signals change their respective logic states such that $\overline{CLOCK}$ becomes a logical 1, and CLOCK becomes a logical 0. Thus, the master latch 10 is not enabled, and the first slave latch 70 is enabled. For the purpose of this discussion, a latch will be said to be enabled when it can receive data, and a latch will be said to not be enabled when it cannot receive new data but stores its last received data. Since there has been no change in the master latch outputs, however, no change is generated in the first slave latch outputs.

At time $t_2$, before the clock signals again change their logic states, and while the master latch 10 is still not enabled, and therefore, is unable to receive new data, the third data signal C changes from a logical 0 to a logical 1. At time $t_3$, the first and second clock signals again change logic states such that $\overline{CLOCK}$ is a logical 0, and CLOCK is a logical 1. Thus, the master latch 10 is enabled and may receive data; while the first slave latch 70 is not enabled and is unable to receive the master latch output signals.

At time $t_4$, the master latch output signals change logic states in response to the change in the logical state of the third data signal, C. $\overline{P}_M$ becomes a logical 0, and $P_M$ becomes a logical 1. The time between $t_3$ and $t_4$ is $t_{pd}$ and is basically one logic gate propagation delay. The outputs from the slave latch 70 remain unchanged since it still is not enabled and cannot receive output signals from the master latch 10.

At time $t_5$, the clock signals again change logical states such that $\overline{CLOCK}$ becomes a logical 1, and CLOCK becomes a logical 0. Thus, the master latch 10 no longer is enabled. At time $t_6$, the logical states of the first slave latch 70 change such that $P_{S1}$ becomes 1, and $\overline{P}_{S1}$ becomes 0. The time between $t_5$ and $t_6$ is $t_{pd}$ and is basically one logic gate propagation delay.

Thus, it will be appreciated that there are substantially only two logic gate propagation delays generated by delays in the gates of the master-slave flip-flop 68.

One logic propagation delay is generated by the master latch 10, and one is generated by the first slave latch 70.

At time $t_6$ before the clock signals again change their logical states, the respective first and second data signals, A and B, change logical states such that A, B and C are logical 1. At time $t_7$, the clock signals change logical states again change such that $\overline{CLOCK}$ becomes a logical 0, and CLOCK becomes a logical 1. Although the master latch 10 is enabled, its outputs do not changen logical states because the logical response of the master latch 10 is unchanged. Consequently, at time $t_8$ when the clock signals again change logical states, and $\overline{CLOCK}$ becomes logical 1 and CLOCK becomes logical 0 and the first slave latch 70 becomes enabled, the outputs of the first slave latch 70 do not change logical states.

At time $t_9$, before the clock signals change their logical states, the first, second and third data signals all become logical 0's. At time $t_{10}$, the clock signals again change logical states such that $\overline{CLOCK}$ becomes logical 0, and CLOCK becomes logical 1. The master latch 10, therefor, is enabled, and at time $t_{11}$ the logical states of the master latch change in response to the new data signals. $P_M$ becomes a logical 1, and $\overline{P}_M$ becomes a logical 0. The time between times $t_{10}$ and $t_{11}$ is $t_{pd}$ which is basically one logic gate propagation delay.

At time $t_{12}$, the clock signals again change logical states such that $\overline{CLOCK}$ becomes logical 1 and CLOCK becomes logical 0. The first slave latch 70, therefore, is enabled, and at time $t_{13}$ the outputs from the first slave latch 70 change in response to the new outputs from the master latch 10. Therefore, $P_{S1}$ becomes a logical 0, and $\overline{P}_{S1}$ becomes a logical 1. The time between $t_{12}$ and $t_{13}$ is $t_{pd}$ which is substantially one logic gate propagation delay. Thus, once again there are substantially two logic gate propagation delays generated by delays in the gates of the master-slave flip-flop 68.

Figure 9:
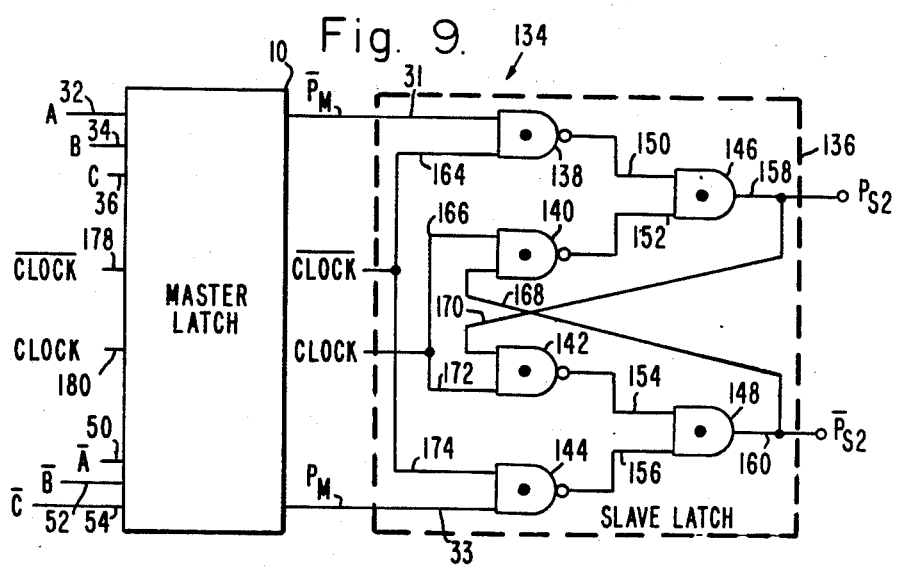
FIG. 9 is a schematic diagram of a second master-slave flip-flop incorporating the latch circuit of FIG. 2.

Referring to the illustrative drawing of FIG. 9, there is shown an alternative master-slave flip-flop 134 in which the master cell 10 comprises the novel disymmetric master latch 10 described above and known second slave latch 136. The slave latch cell 136 comprises first, second, third and fourth NAND logic gates, 138, 140, 142 and 144, respectively, and first and second AND logic gates 146 and 148, respectively.

Respective outputs of the respective first and second NAND logic gates 138 and 140 are operatively connected by respective lines 150 and 152 to first and second inputs to the first AND logic gate 146. Respective outputs of the respective third and fourth NAND logic gates 142 and 144 are operatively connected by respective lines 154 and 156 to first and second inputs to the second AND logic gate 148. The first AND logic gate 146 provides a second slave latch first output signal $P_{S2}$ on line 158, and the second AND logic gate 148 provides a second slave latch second output signal, $\overline{P}_{S2}$, on line 160. The respective first and second output signals, $P_{S2}$ and $\overline{P}_{S2}$ are logical complements of each other. The second slave latch first output signal $P_{S2}$, of course, also is the logical complement of the first master latch output signal $\overline{P}_M$ after the outputs of the master latch cell 10 and second slave latch 136 have settled.

The first NAND logic gate 138 receives the master latch first output signal, $\overline{P}_M$, on line 31 and receives the first clock signal $\overline{CLOCK}$, on line 164. The second NAND logic gate 140 receives the second clock signal, CLOCK, on line 166 and receives the second slave latch output signal, $\overline{P}_{S2}$ on line 168. The third NAND logic gate 142 receives the second slave latch first output signal, $P_{S2}$ on line 170 and receives the first clock signal, CLOCK, on line 172. The fourth NAND logic gate 144 receives the first clock signal, $\overline{CLOCK}$, on line 174 and receives the master latch second output signal, $P_M$, on line 33.

The master latch 10 receives the respective first and second clock signals, $\overline{CLOCK}$ and CLOCK, on respective lines 178 and 180 and receives respective first, second, third, fourth, fifth and sixth data signals, A, B, C, $\overline{A}$, $\overline{B}$ and $\overline{C}$ on respective lines 32, 34, 36, 50, 52 and 54. The details of the master latch 10 are set forth above in the description regarding FIGS. 2, 3 and 4.

Figure 10:
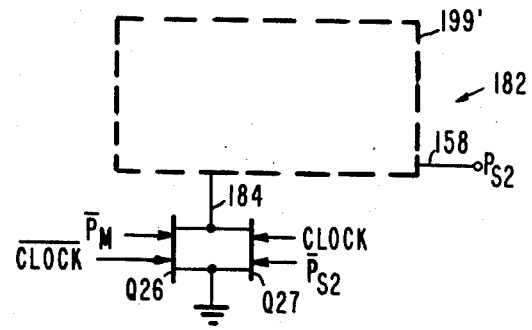
FIG. 10 is a circuit diagram of a fifth depletion mode MESFET logic circuit of a slave latch of the flip-flop of FIG. 9.
Figure 11:
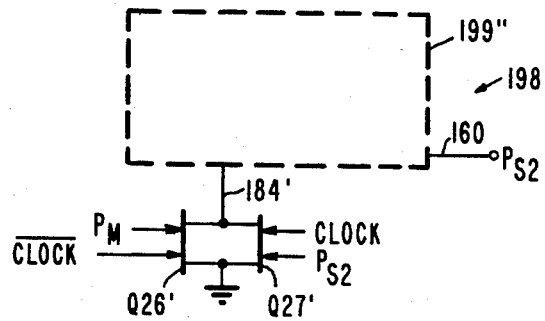
FIG. 11 is a circuit diagram of a sixth depletion mode MESFET logic circuit of the slave latch of the flip-flop of FIG. 9.

FIGS. 10 and 11 illustrate respective fifth and sixth depletion mode MESFET logic circuits, 182 and 198. The fifth logic circuit 182 implements the first and second NAND logic gates, 138 and 140 respectively, and the first AND gate 146 of the second slave latch 136 of FIG. 9. It comprises logic switching transistors $Q_{26}$ and $Q_{27}$; the output signal provided on output line 158 by the fifth logic circuit 182 comprises the second slave latch first signal, $P_{S2}$. The sixth logic circuit 198 implements the third and fourth NAND logic gates, 142 and 144 respectively, and the first AND logic gate 148. It comprises switching transistors $Q_{26}'$ and $Q_{27}'$; the output signal provided on output line 160 by the sixth logic circuit comprises the second slave latch second output signal, $\overline{P}_{S2}$.

The components comprising the respective fifth and sixth logic circuits 182 and 198 and the connections between those components are substantially identical. The only features of the respective fifth and sixth logic circuits 182 and 198 which differ significantly as between one another are the signals input to their respective switching transistors and the signals provided on their respective output lines. Thus, components of the sixth logic circuit 198 are identified in FIG. 11 by primed numerals identical to the numerals referring to corresponding components of the fifth logic circuit 182 illustrated in FIG. 10. Furthermore, active load circuit components, buffering circuit components, voltage offset circuit components and biasing voltage circuit components of the respective fifth and sixth logic circuits 182 and 198 are substantially identical to those described above and illustrated within dashed lines labelled 199 in FIG. 6. Thus, it will be understood that the dashed lines labelled 199' in FIG. 10 and the dashed lines labelled 199" in FIG. 11 enclose circuits and biasing voltages substantially identical to those described above with reference to the third logic circuit 112 discussed above and illustrated in FIG. 6.

Switching transistors $Q_{26}$ and $Q_{27}$ have source electrodes connected to ground and have drain electrodes connected by line 184 to appropriate circuit components (not shown) enclosed by dashed lines 199'. The gate electrodes of dual gate switch transistor $Q_{26}$ receive the first clock signal, $\overline{CLOCK}$, and the master latch first output signal, $\overline{P}_M$. The gate electrodes of dual gate switch transistor $Q_{27}$ receive the second slave latch second output signal, $\overline{P}_{S2}$, and the second clock signal, CLOCK.

Output line 158 on which the second slave latch first output signal, $P_{S2}$, is provided is coupled to appropriate circuit components (not shown) enclosed by dashed lines 199'.

Switching transistors $Q_{26}'$ and $Q_{27}'$ have source electrodes connected to ground and drain electrodes connected by line 184' to appropriate circuit components (not shown) enclosed by dashed lines 199″. The gate electrodes of dual gate switch transistor $Q_{26}'$ receive the first clock signal, $\overline{CLOCK}$, and the master latch second output signal, $P_M$. The gate electrodes of dual gate switch transistor $Q_{27}'$ receive the second slave latch output signal, $P_{S2}$, and the second clock signal, $\overline{CLOCK}$.

Output line 160 on which the second slave latch second output signals, $\overline{P}_{S2}$, are provided is coupled to appropriate circuit components (not shown) enclosed by dashed lines 199″.

The operation of the alternative master-slave flip-flop 134 will be understood based upon the disclosure provided above and need not be set forth in detail herein.

Figure 12:
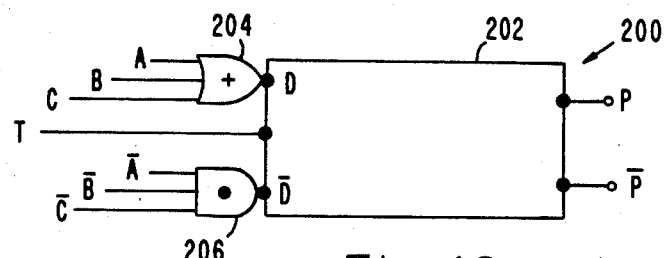
FIG. 12 is a schematic diagram of an illustrative logic circuit which can incorporate either the flip-flop of FIG. 5 or FIG. 9 and which functionally illustrates the principles of the present invention.

FIG. 12 shows an illustrative logic circuit 200 which functionally illustrates the principles of the present invention. The illustrative logic circuit 200 may comprise either the respective first or second flip-flops 68 or 134 of FIG. 5 or 9. More particularly, it comprises a D type flip-flop 202 comprising input nodes for receiving D and $\overline{D}$ inputs, an input node for receiving a timing signal, T, and output nodes for providing P and $\overline{P0}$ output signals. It will be appreciated that the D and $\overline{D}$ inputs could be defined as respective S and R inputs. The illustrative circuit 200 further comprises a three input OR logic gate 204 and a three input AND logic gate 206. The OR logic gate 204 receives three first data input signals A, B and C; and it provides, as its output signal, the D input. The AND gate 206 receives three second data signals $\overline{A}$, $\overline{B}$ and $\overline{C}$, each second data signal corresponding to and representing the logical complement of a corresponding first data signal; and it provides, as its output signal, the $\overline{D}$ input. One will appreciate that the timing signal, T, can be divided internally within the flip-flop 202 into two mutually complementary clock signals by known means such as by a differential circuit. Alternatively, mutually complementary clock signals can be provided to the flip-flop 202 from a well known external clock generator (not shown). Thus, FIG. 12 clearly illustrates the principles of the present invention in the context of a high-speed D flip-flop which can internally generate a D input and a corresponding $\overline{D}$ input from multiple data input signals.

Thus, the present invention provides a novel dissymmetric latch 10 which, for example, can be implemented in the form of a D type flip-flop which can receive multiple data input signals and corresponding multiple complementary data input signals and which can provide corresponding complementary output signals with substantially only two logic gate propagation delays.

Furthermore, it will be understood that the above-described embodiments are merely illustrative of many possible specific embodiments which can represent the principles of the invention. Numerous and varied other arrangements can readily be devised in accordance with these principles without departing from the spirit and scope of the invention. Alternatively, for example, where there are no large fan out requirements, the source follower transistor buffers can be omitted from the respective depletion mode MESFET logic circuits 60 and 62 comprising the novel dissymmetric latch 10. In addition, logic circuits comprising the novel dissymmetric latch 10 can be fabricated using alternate logic approaches such as, for example, Schottky diode FET logic, enhancement mode logic or enhancement-depletion mode logic.

Therefore, it is intended that the scope of the invention not be limited by the above description of preferred embodiments of the invention, but rather that the scope of the invention be defined by the appended claims in which:

What is claimed is:

1. A method of providing first and second output signals, said first output signal being a logical complement of a corresponding second output signal, comprising the steps of:

receiving a first clock signal;

receiving a corresponding second clock signal, said second clock signal being a logical complement of said first clock signal;

receiving N first data signals, where N is an integer, and N>1;

receiving N second data signals, where each second data signal corresponds to a first data signal and is the logical complement of said first data signal;

the steps of receiving said first and second data signals both following the steps of receiving said first and said clock signals;

performing a first logical function characterized by an OR function of first and second logic inputs, said first logic input characterized by a NOR function of said second output signal and said second clock signal, said second logic input of said OR function characterized by a NOR function of said first data signals and said first clock signal; and performing a second logical function characterized by an AND function of third and fourth logic inputs, said third logic input characterized by the NAND function of said first output signal and said first clock signal, said fourth logic input of said AND function characterized by the NAND function of said second data signals and said second clock signal;

the steps of performing said first and second logical functions both following the steps of receiving said first and second data signals.

2. A dissymmetric integrated circuit latch for providing first and second output signals, each first output signal being a logical complement of a corresponding second output signal, comprising:

means for receiving a first clock signal;

means for receiving a corresponding second clock signal, said second clock signal being a logical complement of said first clock signal;

means for receiving N first data signals, where N is an integer and N>1;

means for receiving N second data signals, where each second data signal corresponds to a first data signal and is the logical complement of a corresponding first data signal;

NOR-OR logic function means including first and second NOR logic gates and an OR logic gate, each of said logic gates including an output terminal and a plurality of input terminals;

NAND-AND logic function means including first and second NAND logic gates and an AND logic gate, each of said last-recited logic gates including an output terminal and a plurality of input terminals;

one input terminal of said first NOR logic gate being coupled to said means for receiving said first clock signal and the remaining input terminals of said first NOR logic gate being coupled to said means for receiving N first data signals;

the input terminals of said second NOR logic gate being coupled to the output terminal of said AND logic gate and to said means for receiving said second clock signal;

the input terminals of said OR logic gate being coupled to the output terminals of said first and second NOR logic gates;

the output terminal of said OR logic gate providing said first output signal;

one input terminal of said second NAND logic gate being coupled to said means for receiving said second clock signal and the remaining input terminals of said second NAND logic gate being coupled to said means for receiving N second data signals;

the input terminals of said first NAND logic gate being coupled to the output terminal of said OR logic gate and to said means for receiving said first clock signal;

the input terminals of said AND logic gate being coupled to the output terminals of said first and second NAND logic gates; and the output terminal of said AND logic gate providing said second output signal.

3. A dissymmetric integrated circuit latch as in claim 2 wherein said NOR-OR logic function means and said NAND-AND logic function means each comprises a merged logic structure wherein each of said structures performs multiple logic functions with basically only a single gate propagation delay between the reception of the corresponding data signals and an enabling clock signal and the provision of corresponding first and second output signals.

4. A dissymmetric integrated circuit latch as in claim 3 wherein said merged logic structures are fabricated from GaAs.

5. In an integrated circuit master-slave flip-flop, an improved master latch for providing master latch first and second output signals, each master latch first output signal being a logical complement of a corresponding master latch second output signal, said improved master latch comprising:

means for receiving a first clock signal;

means for receiving a corresponding second clock signal, said second clock signal being a logical complement of said first clock signal;

means for receiving N first data signals, where N is an integer and N>1;

means for receiving N second data signals, where each second data signal corresponds to a first data signal and is the logical complement of a corresponding first data signal;

NOR-OR logic function means including first and second NOR logic gates and an OR logic gate, each of said logic gates including an output terminal and a plurality of input terminals;

NAND-AND logic function means including first and second NAND logic gates and an AND logic gate, each of said last-recited logic gates including an output terminal and a plurality of input terminals;

one input terminal of said first NOR logic gate being coupled to said means for receiving said first clock signal and the remaining input terminal of said first NOR logic gate being coupled to said means for receiving N first data signals;

the input terminals of said second NOR logic gate being coupled to the output terminal of said AND logic gate and to said means for receiving said second clock signal;

the input terminals of said OR logic gate being coupled to the output terminals of said first and second NOR logic gates;

the output terminal of said OR logic gate providing said first output signal;

one input terminal of said second NAND logic gate being coupled to said means for receiving said second clock signal and the remaining input terminals of said second NAND logic gate being coupled to said means for receiving N second data signals;

the input terminals of said first NAND logic gate being coupled to the output terminal of said OR logic gate and to said means for receiving said first clock signal;

the input terminals of said AND logic gate being coupled to the output terminals of said first and second NAND logic gates; and the output terminal of said AND logic gate providing said second output signal.

6. A dissymmetric integrated circuit latch as in claim 5 wherein said NOR-OR logic function means and said NAND-AND logic function means each comprises a merged logic structure wherein each of said structures performs multiple logic functions with basically only a single gate propagation delay between the reception of the corresponding data signals and an enabling clock signal and the provision of corresponding first and second output signals.

7. A dissymmetric integrated circuit latch as in claim 6 wherein said merged logic structures are fabricated from GaAs.

* * * * *